(12) United States Patent
Diba et al.

(10) Patent No.: US 6,466,049 B1
(45) Date of Patent: Oct. 15, 2002

(54) CLOCK ENABLE CONTROL CIRCUIT FOR FLIP FLOPS

(75) Inventors: Sholeh Diba, Cupertino; Wei-Yi Ku, San Jose; Jeffrey H. Seltzer, Los Gatos, all of CA (US)

(73) Assignee: Xilinx, Inc., San Jose, CA (US)

( * ) Notice: Subject to any disclaimer, the term of this patent is extended or adjusted under 35 U.S.C. 154(b) by 3 days.

(21) Appl. No.: 09/661,923

(22) Filed: Sep. 14, 2000

(51) Int. Cl.$^7$ ................................................ G06F 7/38

(52) U.S. Cl. ............................ 326/37; 326/40; 326/46

(58) Field of Search ............................... 326/37–41, 46

(56) References Cited

U.S. PATENT DOCUMENTS 5,986,465 A * 11/1999 Mendel ........................ 326/39
6,066,961 A * 5/2000 Lee et al. ..................... 326/39

OTHER PUBLICATIONS

"The Programmable Logic Data Book", 1999, available from Xilinx, Inc., 2100 Logic Drive, San Jose, California 95124, pp. 5–5 through 5–20.

* cited by examiner

*Primary Examiner*—Michael Tokar
*Assistant Examiner*—Anh Q. Tran
(74) *Attorney, Agent, or Firm*—Patrick T. Bever, Esq.

(57) ABSTRACT

A clock enable control circuit for controlling flip flops on a programmable logic device. The clock enable control circuit either passes an original data signal to the input terminal of a flip flop, or feeds back an output signal from the output terminal to the input terminal of the flip flop in response to a clock enable control signal. The clock enable control signal is selected from one of a set control signal and a reset control signal that are otherwise provided on the programmable logic device to selectively control set and reset functions of the flip flop. In one embodiment, the set and reset control signals are generated as product-term signals that are programmably routed by a product-term allocator circuit to a macrocell including the flip flop and the clock enable control circuit.

13 Claims, 7 Drawing Sheets

CLOCK ENABLE CONTROL CIRCUIT FOR FLIP FLOPS

FIELD OF THE INVENTION

This invention relates to the field of integrated circuits, and more specifically to configurable logic circuits utilized in programmable logic devices.

BACKGROUND OF THE INVENTION

Programmable logic devices (PLDs) are a class of integrated circuits (ICs) that can be programmed by a user to emulate various logic functions. Logic designers typically use PLDs to implement control logic in electronic systems because they are relatively easy to program, and often can be reprogrammed to update the emulated logic function. This often makes the use of PLDs less costly in comparison to custom hardwired or "application specific" integrated circuits (ASICs).

One major class of PLDs includes a set of input pins, a programmable AND plane connected to the input pins, an OR plane connected to output terminals of the AND plane, and a set of output pins connected to output terminals of the OR plane. The AND plane includes a series of column conductors, a series of row conductors, and a matrix of programmable switches provided at each intersection of a column conductor and a row conductor. Input signals are applied through the input pins to the column conductors, which are selectively applied to the row conductors through the programmable switches. Each row conductor performs a logic AND or NAND function on all input signals transmitted to that row conductor through a programmed switch (note that input signals are not passed to the row conductor through non-programmed switches). Because of the logic AND (or NAND) function performed by each row conductor, the row conductors are typically referred to as product-term (P-term) elements, and are represented by logic AND gates. These P-term elements generate P-term signals that are transmitted to the OR plane. The OR plane may be programmable to selectively connect each P-term element to any available OR gate, in which case the PLD is called a programmable logic array (PLA). Alternatively, the OR plane may be fixed, such that each P-term element is connected to an associated OR gate, in which case the PLD is called a programmable array logic (PAL) device.

Early PLAs and PALs were well received by logic designers. However, as logic functions grew increasingly larger and more complex, logic designers were required to wire together two or more small PLAs/PALs to provide sufficient logic capacity. Although this process was tolerated during development and testing, it increased the cost and size of production units. This generated a demand for PLDS with increasingly larger logic capacity.

To meet the ever-increasing demand for greater capacity, PLDs with increasingly complex architectures have been developed. One popular complex PLD type, known as complex programmable logic devices (CPLDS), includes two or more "function blocks" connected together and to input/output (I/O) resources by an interconnect switch matrix. Each function block of the CPLD is structured like the two-level PLAs/PALs, described above. In effect, these CPLDs incorporate several early PLAs/PALs and associated connection circuitry onto a single integrated circuit, thereby allowing a circuit designer to implement a complex logic function using a single IC.

Figure 1:
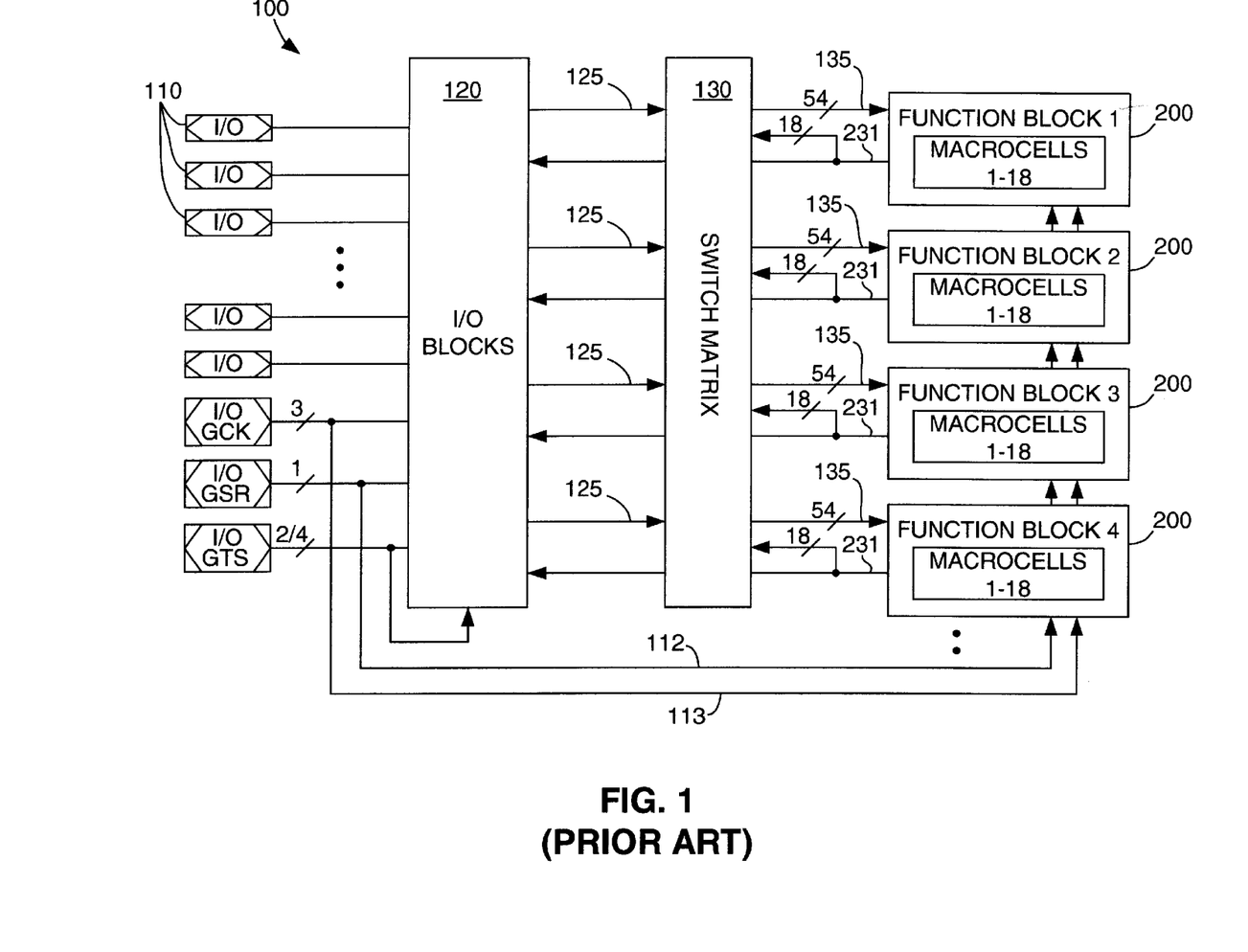
FIG. 1 is a circuit diagram showing a conventional CPLD including multiple function blocks.

FIG. 1 shows a simplified block diagram of a CPLD 100 that includes features common to the XC9500 CPLD family produced by Xilinx, Inc. of San Jose, Calif. Each CPLD 100 of the XC9500 CPLD family consists of input/output (I/O) pins 110, I/O blocks (IOBs) 120, an interconnect switch matrix 130, and several function blocks (FBs) 200 (four shown). IOBs 120 provide buffering for device input and output signals that are applied to I/O pins 110. All input signals from IOBs 120 enter switch matrix 130 on switch matrix input lines 125, and selected output signals from FBs 200 are fed back into switch matrix 130 on macrocell output lines 231. Each FB 200 receives fifty-four (54) input signals on FB input lines 135 from switch matrix 130 and produces ninety (90) P-term signals that are applied to any of eighteen (18) macrocells, each macrocell being programmable to provide a sum-of-products term using selected P-term signals. For each FB 200, twelve to eighteen output signals are selectively transmitted on macrocell output lines 231 to directly drive I/O blocks 120 (along with optional corresponding output enable signals). In addition, each FB 200 selectively receives global set/reset signals and global clock signals on global set/reset lines 112 and global clock lines 113, respectively. These global signals are utilized to selectively synchronize, for example, the clocking operations of flip flops located in FBs 200.

Figures 2A, 2C:
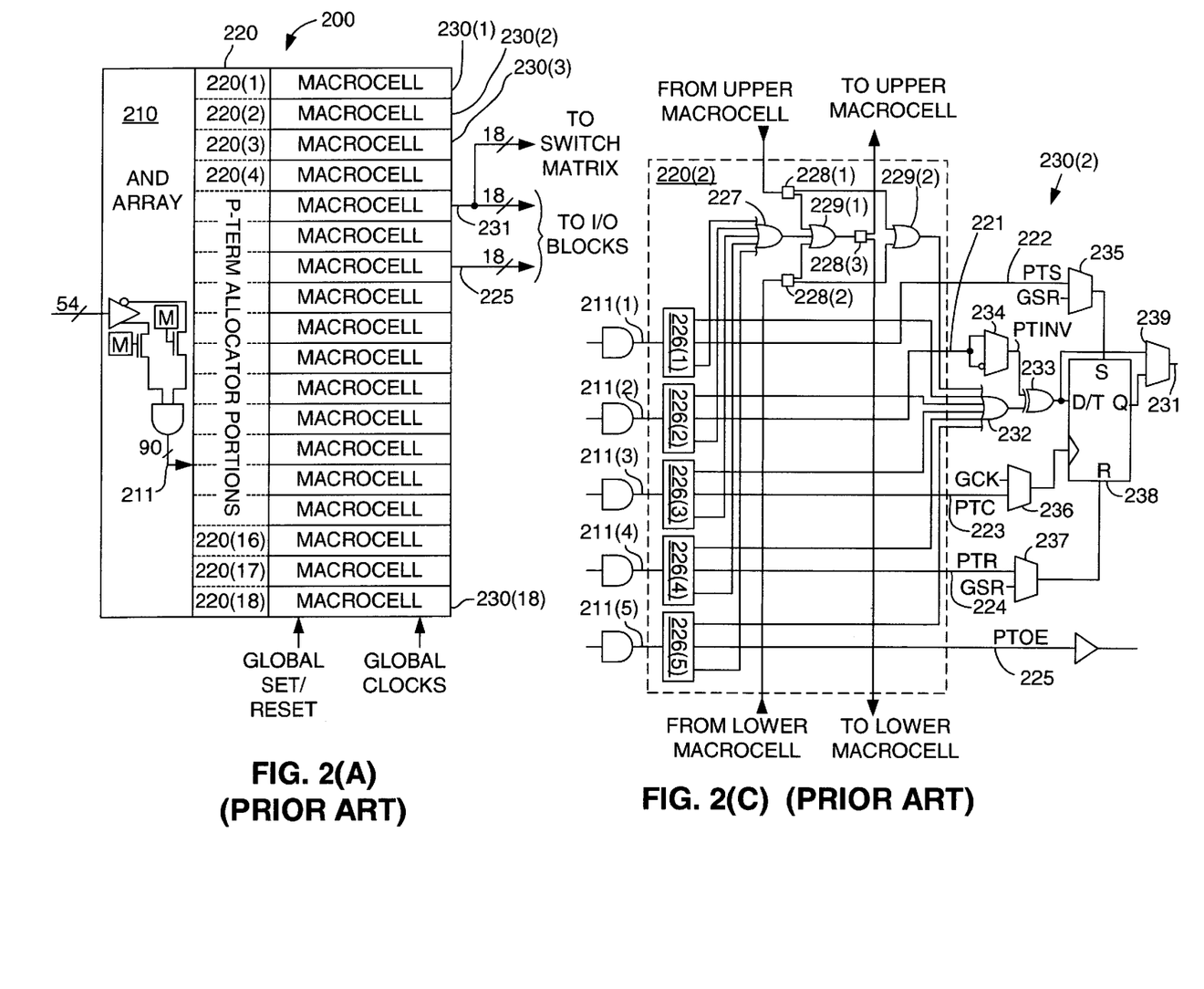
FIG. 2(A) is a simplified block diagram of a function block of the conventional CPLD shown in FIG. 1.
FIG. 2(C) is a simplified schematic diagram illustrating a product term allocator of the function block shown in FIG. 2(A)

FIG. 2(A) shows a simplified block diagram of an FB 200. Each FB 200 includes an AND array 210, product term (P-term) allocator circuit 220, and eighteen macrocells 230(1) through 230(18). AND-array 210 receives fifty-four (54) signals on input lines 135 from the switch matrix 130 (see FIG. 1), and generates ninety (90) P-term signals that are routed to the macrocells 230(1) through 230(18) via P-term allocator circuit 220. The P-term allocator circuit 220 includes eighteen portions 220(1) through 220(18) that are associated with macrocells 230(1) through 230(18), respectively. P-term allocator circuit 220 selectively routes the P-term signals from AND-array 210 to selected macrocells 230(1) through 230(18) in the manner described below. Output signals transmitted from the macrocells 230(1) through 230(18) are then routed back to the switch matrix 130 on macrocell output lines 231 for use as input signals in other FBs 200, or are routed to corresponding I/O pins 110 through the IOBs 120 along with optional corresponding output enable (OE) signals, which are transmitted on P-term OE lines 225.

Figure 2B:
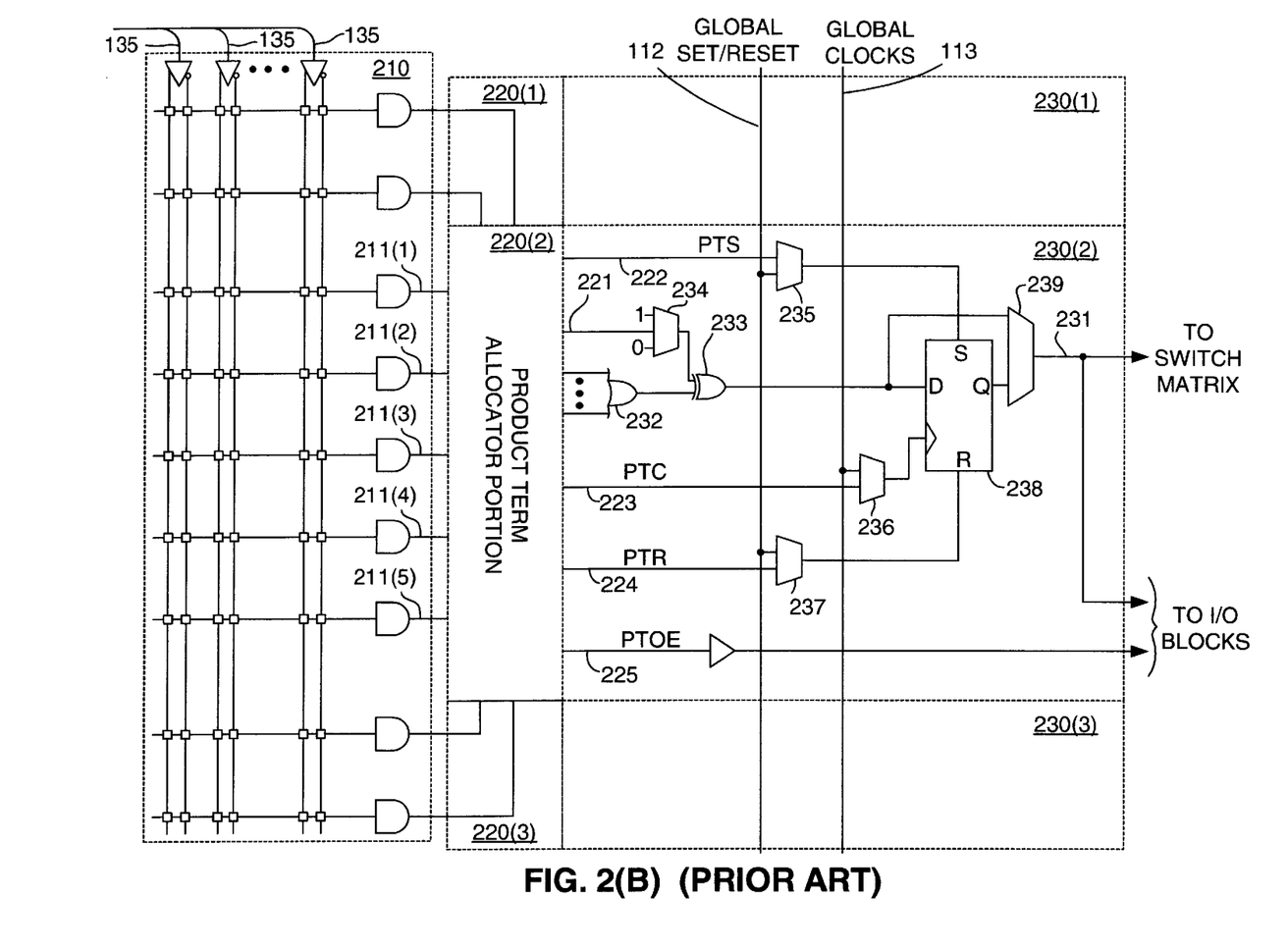
FIG. 2(B) is a simplified schematic diagram illustrating a macrocell of the function block shown in FIG. 2(A)

FIG. 2(B) is a simplified schematic diagram showing macrocell 230(2), which is representative of all eighteen macrocells of FB 200, in additional detail. Macrocell 230(1) includes OR gate 232, an exclusive OR (XOR) gate 233, P-term routing multiplexers (MUXes) 234 through 237, a D-type flip flop 238 and a bypass MUX 239. As discussed further below, macrocell 230(2) receives up to five "direct" P-term elements 211(1) through 211(5) and up to eighty-five (85) "indirect" P-term elements (four shown) through P-term allocator portion 220(2). Unlike the "indirect" P-term elements, the P-term signals transmitted from "direct" P-term elements 211(1) through 211(5) are selectively routed either as logic signals that are applied to OR gate 232 (i.e., to generate a sum-of-products term), or as control signals that are selectively utilized to control the operation of macrocell 230(2). Alternatively, P-term elements 211(1) through 211(5) may be routed by P-term allocator portion 220(2) to other macrocells of FB 200. OR gate 232 generates a sum-of-products term in response to selected P-term signals received from P-term allocator portion 220(2) in accordance with a user's logic function. The sum-of-products term generated by OR gate 232 is transmitted to an input terminal of XOR gate 233, which is also connected to the output terminal of P-term control MUX 234. MUX 234 is controlled by a configuration memory cell (not shown) to selectively pass a P-term invert (PTINV) control signal from P-term invert line 221 to exclusive OR (XOR) gate 233, which then selectively inverts the sum-of-products term generated by OR gate 232. P-term routing MuXes 235 through 237 selectively pass either P-term control signals received from P-term allocator portion 220 (2) or global control signals to the control terminals of flip flop 238. For example, MUX 235 is controlled to selectively pass either a P-term set (PTS) control signal from P-term set line 222 or a global set/reset signal from global set/reset line 112 to set terminal S of flip flop 238. MUX 236 is controlled to selectively pass either a P-term clock (PTC) control signal from P-term clock line 223 or a global clock signal from global clock line 113 to the clock terminal of flip flop 238. MUX 237 is controlled to selectively pass either a P-term reset (PTR) control signal from P-term reset line 224 or the global set/reset signal from global set/reset line 112 to reset terminal R of flip flop 238. Finally, bypass MUX 239 has a first input terminal connected to the output terminal of XOR gate 233 and a second input terminal connected to data output terminal Q of flip flop 238. Bypass MUX 239 is controlled by a configuration memory cell (not shown) to selectively pass the sum-of-products term directly from XOR gate 233 to macrocell output line 231 during asynchronous logic operations, or to pass the sum-of-products term from data output terminal Q to macrocell output line 231 during synchronous logic operations.

FIG. 2(C) is a simplified diagram showing the internal logic of the P-term allocator portion 220(2), which is representative of all of the P-term allocator portions of P-term allocator circuit 220. P-term allocator portion 220(2) includes demultiplexers (DMUXs) 226(1) through 226(5), an OR gate 227, DMUXs 228(1) through 228(3), and OR gates 229(1) and 229(2). P-term elements 211(1) through 211(5) are respectively transmitted to DMUXs 226(1) through 226(5). DMUXs 226(1) through 226(5) are programmable to route their associated P-term elements to any one of three lines: to an input of OR gate 227 of the P-term allocator portion 220(2), to an input of OR gate 232 of the macrocell 230(2), or to an associated local P-term line extending into macrocell 230(2) (respectively, P-term invert line 221, P-term set line 222, P-term clock line 223, P-term reset line 224, and P-term OE line 225). P-term signals selectively transmitted by DMUXs 226(1) through 226(5) to OR gate 227 are "exported" to other macrocells of FB 200. Specifically, the P-term signals transmitted from DMUXs 226(1) through 226(5) to OR gate 227 are "ORed" to produce a sum-of-products term which is applied to OR gate 229(1). OR gate 229(1) selectively "ORs" this sum-of-products term with P-term signals received from adjacent P-term allocator portions 220(1) and/or 220(3) (see FIG. 2(B)), which are received through DMUX 228(1) and/or DMUX 228(2), respectively. The output of OR gate 229(1) is then routed through DMUX 228(3) to adjacent P-term allocator portions 220(1) or 220(3). By selectively combining (ORing) selected P-term signals using the OR gates 227 of the P-term allocator portion 220(2), it is possible to implement equations having up to ninety (90) P-terms in macrocell 230(2).

While P-term allocator 220(2) and macrocell 230(2) provide many useful features that can be utilized to perform a user's logic function, there is a need for PLDs providing even more flexibility. For example, many logic functions call for a clock enable function that allows a user to selectively "turn off" a flip flop (i.e., suspend the clocking operation, thereby "freezing" a currently-stored logic value).

One method of providing this function would be to include an additional P-term element in each P-term allocator that can be used to control (i.e., enable and disable) the clocking function of the flip flop. However, adding a P-term element to each P-term allocator would require substantial changes to the existing PLD architecture. Further, passing a clock signal through a gate may introduce unacceptable delays, and may also introduce erroneous clock pulses in the clock signal.

What is needed is a clock enable control circuit that controls the clock enable function of the flip flops provided on a PLD, and can be incorporated into the existing PLD architecture without requiring additional control signal structures. Ideally, such a clock enable control circuit would not introduce delays or erroneous clock pulses in the transmission of clock signals to the flip flops of the PLD.

SUMMARY OF THE INVENTION

The present invention is directed to a clock enable control circuit that can be incorporated into an existing PLD architecture without requiring additional control signal structures, and does not introduce additional delays or erroneous clock pulses in transmission of clock signals to the flip flops of the PLD.

In accordance with a first aspect of the present invention, the clock enable control circuit includes a switching circuit that allows either a flip flop set control signal or a flip flop reset control signal to be utilized as the flip flop clock enable (CE) control signal. In typical PLDs, dedicated programmable circuitry is provided for selectively transmitting a set control signal to the set terminal of each flip flop, and for selectively transmitting a reset control signal to the reset terminal of each flip flop. The present inventors recognize that both a set and a reset signal are rarely utilized by the same flip-flop during the implementation of a user's logic function. Therefore, by utilizing the programmable circuitry provided for an unused set/reset control signal, the present invention facilitates the clock enable function without significantly altering the architecture of conventional PLDs.

In accordance with another aspect of the present invention, the clock enable (CE) control signal is used to either pass a data signal value to the data input terminal of a D-type flip flop, or to feed back a currently-stored data value from the data output terminal of the flip flop to the data input terminal. When the currently-stored data value is fed back to the data input terminal, the clocking function of the flip flop is essentially disabled, even though the clock signal continues to be applied to the clock terminal of the flip flop. Therefore, the clock enable function is provided without introducing a pass transistor or other logic element in the clock signal path that could introduce undesirable delays in the clock signal transmission.

In accordance with an embodiment of the present invention, a clock enable control circuit is provided to control the clock enable function of a D-type flip flop on a PLD. The clock enable control circuit includes a data multiplexer and a switching circuit. The data multiplexer has a first input terminal connected to the data output terminal of the flip flop, and a second input terminal for receiving a data signal from other logic circuitry provided on the PLD. The output terminal of the data multiplexer is connected to the data input terminal of the flip flop. The switching circuit is controlled by two configuration memory cells to selectively route the set control signal and the reset control signal, which are also generated by other PLD logic circuitry, either to corresponding set/reset terminals of the flip flop, or to the select terminal of the data multiplexer. Accordingly, the data multiplexer is selectively controlled by the set/reset control signal passed from the switching circuit to either pass data signals to the flip flop (i.e., during normal operation), or to feed back a data value stored in the flip flop, thereby effectively disabling a clock signal applied to the clock input terminal of the flip flop. Because the switching circuit can be implemented in a minimum amount of space and requires only two configuration memory cells, the clock enable control circuit of the present invention requires minimal changes to the programmable circuitry of a conventional PLD, thereby minimizing the required design changes and associated costs necessary to implement the present invention.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

Figure 3A:
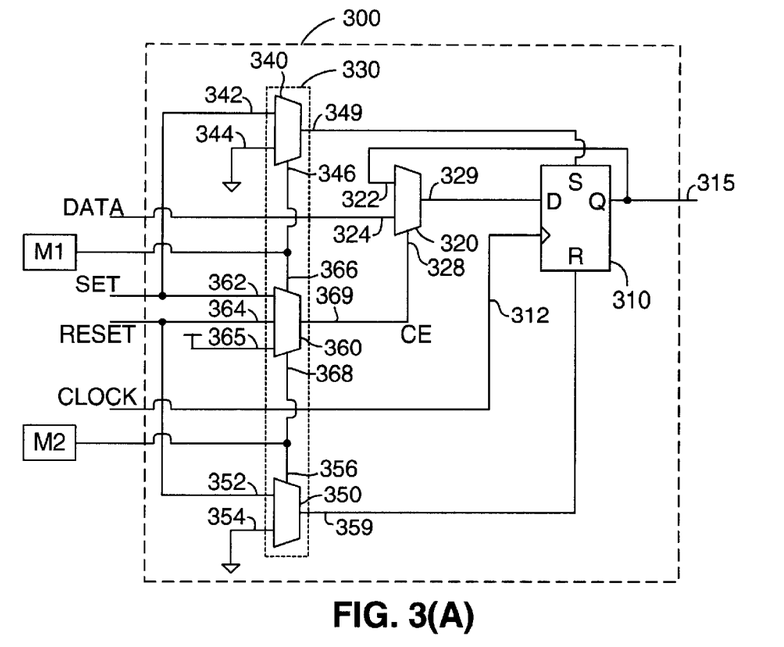
FIG. 3(A) is a simplified schematic diagram of a flip flop circuit in accordance with a first embodiment of the present invention.

FIG. 3(A) is a simplified schematic diagram showing a clock enable control circuit 300 for controlling the clock enable function of a D-type flip flop 310 on a programmable logic device in accordance with a first embodiment of the present invention. Flip flop 310 includes a data input terminal D, a set terminal S, a reset terminal R, a data output terminal Q, and a clock terminal (indicated by the triangular symbol). The operation of D-type flip flops is well known, and will not be described herein in detail. Clock enable control circuit 300 includes an input multiplexer 320 and a switching circuit 330, which are described in detail below.

Multiplexer 320 is controlled by a clock enable (CE) control signal to pass either an original DATA signal value or a feedback signal value to data input terminal D of flip flop 310. Specifically, multiplexer 320 includes a first input terminal 322 that is connected to data output terminal Q of flip flop 310, a second input terminal 324 connected to receive the DATA signal value, a select terminal 328 connected to receive the CE control signal, and an output terminal 329 connected to data input terminal D of flip flop 310. When the CE control signal is in a first state (e.g., low or logic zero), multiplexer 320 feeds back the logic value present on output terminal Q, thereby effectively disabling the clock signal applied to the clock terminal of flip flop 310. Alternatively, when the CE control signal is in a second state (e.g., high or logic one), multiplexer 320 passes the DATA signal value to data input terminal D of flip flop 310, thereby effectively enabling the clock signal applied to the clock terminal of flip flop 310.

In accordance with a first aspect of the present invention, switching circuit 330 includes a series of switches that allow either a set or a reset signal to be utilized as the CE control signal. In other words, typical PLDs include programmable circuitry for selectively transmitting a set signal to the set terminal of each flip flop, and programmable circuitry for selectively transmitting a reset signal to the reset terminal of each flip flop. The present inventors recognize that while set and reset signals are often utilized to control flip flops during the implementation of a user's logic function, both are rarely utilized by a particular flip-flop in the same logic function at the same time. Therefore, switching circuit 330 facilitates the clock enable function provided by multiplexer 320 by selectively passing the unused SET control signal or RESET control signal to the select terminal of multiplexer 320. In other words, the SET/RESET control signal that is "used" by the user's logic function is routed by switching circuit 330 to set terminal S or reset terminal R of flip flop 310, and the "unused" SET/RESET control signal is routed to select input terminal 328 of multiplexer 320. Of course, in the rare logic functions that use both SET and RESET control signals, neither is available to perform the clock enable control function.

Referring again to FIG. 3(A), switching circuit 330 includes a first multiplexer (switch) 340, a second multiplexer (switch) 350, and a third multiplexer 360. First multiplexer 340 includes a first input terminal 342 connected to receive the SET control signal, a second input terminal 344 connected to ground (logic zero), a select terminal 346 and an output terminal 349 connected to set terminal S of flip flop 310. Second multiplexer 350 includes a first input terminal 352 connected to receive the RESET control signal, a second input terminal 354 connected to ground (logic zero), a select terminal 356 and an output terminal 359 connected to reset terminal R of flip flop 310. Third multiplexer 360 includes a first input terminal 362 connected to receive the SET control signal, a second input terminal 364 connected to receive the RESET control signal, a third input terminal 365 connected to power high (logic one), a first select terminal 366, a second select terminal 368, and an output terminal 369 through which the CE control signal is transmitted to select terminal 328 of multiplexer 320.

In accordance with another aspect of the present invention, first multiplexer 340, second multiplexer 350 and third multiplexer 360 are controlled by two memory cells M1 and M2. Specifically, a first configuration data value stored in first memory cell M1 is applied to select terminal 346 of first multiplexer 340 and first select terminal 366 of third multiplexer 360, and a second configuration data value stored in second memory cell M2 is applied to select terminal 356 of second multiplexer 350 and second select terminal 368 of third multiplexer 360. Accordingly, the first and second configuration data values stored in memory cells M1 and M2 selectively control switching circuit 330 to generate the CE control signal in accordance with three states. In a first state, both the SET control signal and the RESET control signal are passed to the set terminal S and the reset terminal R, respectively, of flip flop 310 (a fixed logic one signal is transmitted as the CE control signal to the select terminal of multiplexer 320, so the flip flop is always enabled). In a second state, the SET control signal is passed to set terminal S of flip flop 310, and the RESET control signal is transmitted as the CE control signal to select terminal 328 of multiplexer 320 (a logic zero signal is transmitted to reset terminal R of flip flop 310). Finally, in the third state, the RESET control signal is passed to the reset terminal R of flip flop 310, and the SET control signal is transmitted as the CE control signal to select terminal 328 of multiplexer 320 (a logic zero signal is transmitted to set terminal S of flip flop 310).

Figure 3B:
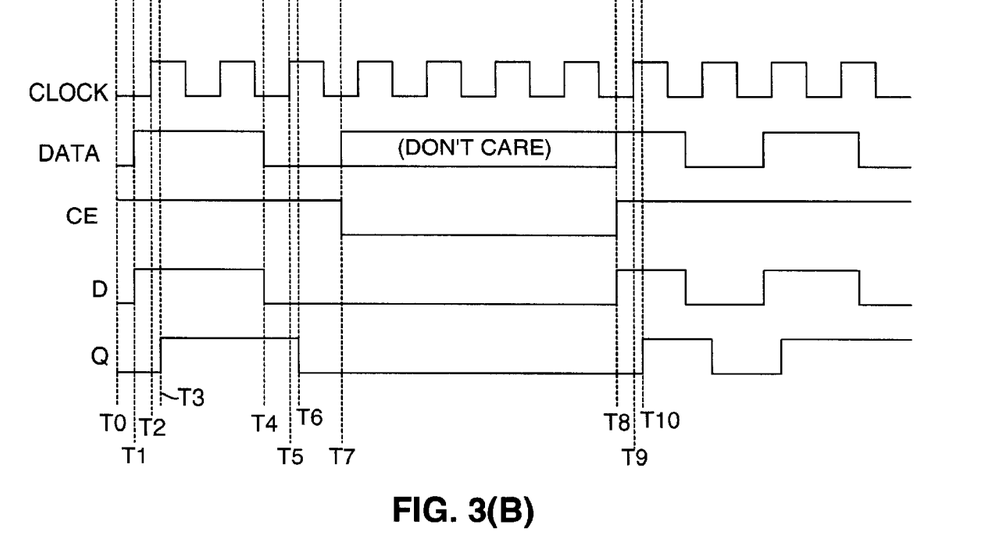
FIG. 3(B) is a timing diagram showing logic states of various signals of the flip flop circuit in FIG. 3(A) in accordance with an example.

FIG. 3(B) is a timing diagram showing the operation of clock enable control circuit 300 (shown in FIG. 3(A)). The timing diagram assumes that one of the SET control signal and the RESET control signal are utilized as the CE control signal, which is selectively changed to enable/disable the clock enable function of clock enable control circuit 300. For example, at time T0, the CE control signal is high (logic one), thereby causing multiplexer 320 to pass the DATA signal value to data input terminal D of flip flop 310. In the present example, the DATA signal value is low (logic zero) at time T0, as is the logic value at data output terminal Q. Also in accordance with the present example, at time T1 the DATA signal value switches high (logic one). Because the CE control signal remains high, this data value is passed to data input terminal D of flip flop 310. At a subsequent time T2 determined by the next rising edge of the CLOCK signal, this high DATA signal value is latched into flip flop 310, and at a subsequent time T3 (determined by the master/slave clock delay), this high value appears at data output terminal Q of flip flop 310. The example further assumes a subsequent change in the DATA signal value from logic one to logic zero at time T4, which is latched into flip flop 310 at time T5 (i.e., the next rising edge of the CLOCK signal), and appears at data output terminal Q at time T6.

According to the example shown in FIG. 3(B), at time T7 the CE control signal changes from high to low, thereby disabling the clock enable function of flip flop 310 and feeding back the signal at data output terminal Q to data input terminal D. While the CE control signal remains logic zero (i.e., between time T7 and T8), any changes in the DATA signal value are ignored by clock enable control circuit 300, thereby effectively disabling the CLOCK signal. Note that actual disconnection of the CLOCK signal is not required to perform the clock disable function, thereby preventing erroneous clock pulse generation and/or delays in the clock signal that would be required to perform this actual disconnection.

Referring again to FIG. 3(B), at time T8 the CE control signal changes again to logic one, thereby enabling the clock enable function of clock enable control circuit 300 (i.e., reconnecting the DATA signal value to data input terminal D of flip flop 310). In the present example, the DATA signal value is logic one at time T8, so the data value at data input terminal D is also logic high. At time T9 (coincident with the next rising edge of the CLOCK signal), the logic one at data input terminal D is latched into flip flop 310, and at time T10 (determined by the master/slave clock delay), this high value appears at data output terminal Q of flip flop 310. Subsequent changes to the DATA signal value while the CE control signal remains at the high (logic one) signal level are latched into flip flop 310 in the manner described above with reference to the time period between time T0 and time T7.

Figure 4:
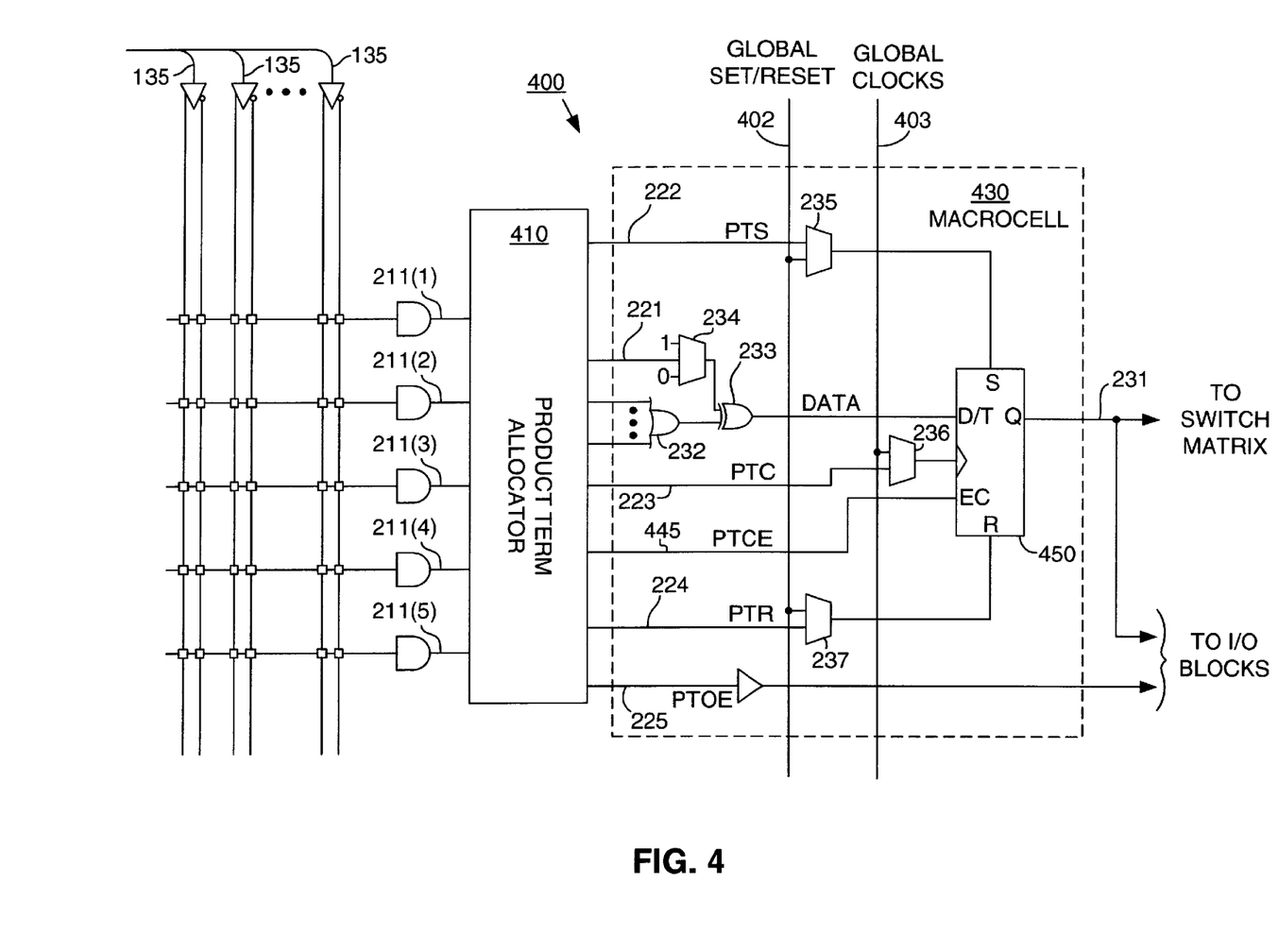
FIG. 4 is a simplified schematic diagram illustrating a portion of a CPLD incorporating a P-term allocator and a macrocell in accordance with a second embodiment of the present invention.
Figure 5:
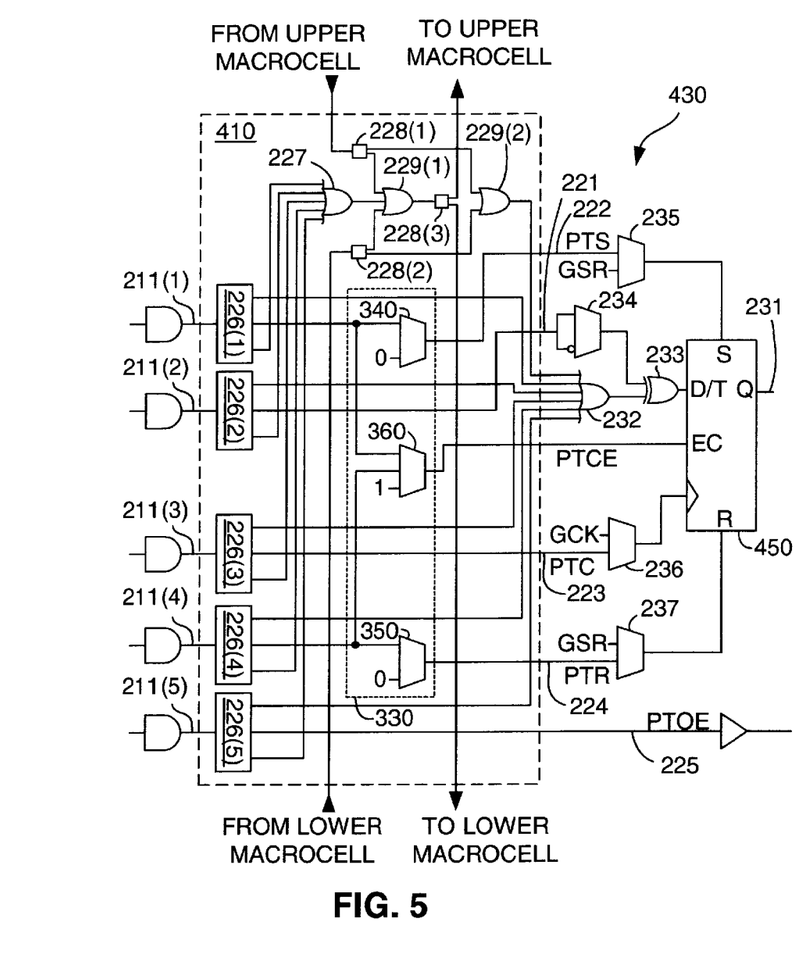
FIG. 5 is a simplified schematic diagram showing the P-term allocator of FIG. 4.
Figure 6:
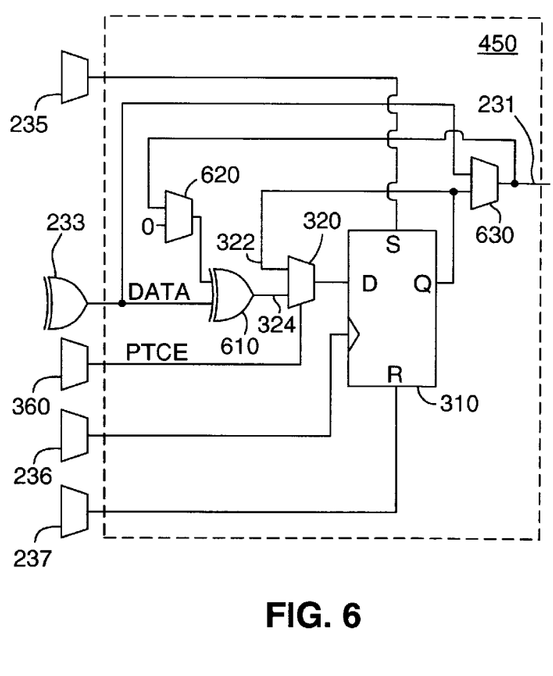
FIG. 6 is a simplified schematic diagram showing the macrocell of FIG. 4 in additional detail.

FIGS. 4 through 6 illustrate a programmable circuit 400 that represents a portion of a CPLD formed in accordance with a second embodiment of the present invention. A brief description of the XC9500XL CPLD family is provided below. Additional description of the XC9500XL CPLD family is provided in The Programmable Logic Data Book, 1999, pp. 5-5 through 5-20, published by Xilinx, Inc., which pages are incorporated herein by reference.

Programmable circuit 400 includes programmable elements that are identical to corresponding elements in conventional P-term allocator portion 220(2) and macrocell 230(2) of CPLD 100 (see FIGS. 1 through 2(C)), and also includes novel elements provided in accordance with the present invention. Elements of programmable circuit 400 that correspond to like elements in conventional P-term allocator portion 220(2) and macrocell 230(2) are identified with the same reference numbers, and the description of these commonly-numbered elements provided above is incorporated in the following description for brevity. Because these commonly-numbered corresponding elements provide essentially the same functions as those described above, a CPLD incorporating programmable circuit 400 in place of P-term allocator portion 220(2) and macrocell 230(2) (i.e., with all other circuit structures essentially unchanged) provides the same functions as those described above with respect to CPLD 100 (see FIG. 1). In addition, such a CPLD incorporating programmable circuit 400 also provides the additional features, described below, that are associated with the novel elements according to the present invention.

Referring to FIG. 4, programmable circuit 400 includes a P-term allocator circuit 410 and a macrocell 430. Similar to conventional P-term allocator circuit 220 (see FIG. 2(A)), P-term allocator circuit 410 receives P-term signals 211(1) through 211(5), and selectively transmits these signals as a P-term set signal PTS, a P-term invert signal, a P-term clock signal PTC, a P-term reset signal PTR, a P-term output enable signal PTOE, and as the DATA signal value. Macrocell 430 includes essentially the same logic gates and programmable multiplexers (switches) that are used to implement a portion of a user's logic function in conventional macrocell 230 (described above). In addition, macrocell 430 includes a novel flip flop circuit having an enable clock terminal EC. In accordance with the present invention, P-term allocator circuit 410 differs from conventional P-term allocator circuit 220(2) (see FIG. 2(C)) in that it generates a P-term clock enable signal PTCE that is transmitted to enable clock terminal EC of flip flop circuit 450. P-term allocator circuit 410 is described in additional detail below with reference to FIG. 5. Flip flop circuit 450 is described in additional detail below with reference to FIG. 6.

Referring to FIG. 5, P-term allocator circuit 410 includes elements that are identical to those of conventional P-term allocator portion 220(2) (see FIG. 2(C)) that are identified with the same reference numbers. In the present embodiment, P-term allocator circuit 410 differs from conventional P-term allocator 220(2) in that it includes switching circuit 330, which is described above with reference to FIG. 3(A). Specifically, first multiplexer 340 of switching circuit 330 has an input terminal connected to demultiplexer 226(1), and an output terminal connected to an input terminal of multiplexer 235. Similarly, second multiplexer 350 has an input terminal connected to demultiplexer 226(4), and an output terminal connected to an input terminal of multiplexer 237. Finally, third multiplexer 360 has a first input terminal connected to demultiplexer 226(1), a second input terminal connected to demultiplexer 226(4), and an output terminal connected to enable clock terminal EC of flip flop circuit 450. Similar to conventional P-term allocator circuit 220(2), multiplexers 235 and 237 apply their respective output signals to the set terminal S and reset terminal R of flip flop circuit 450. Therefore, the P-term value selectively applied to the input terminals of third multiplexer 360 is generated by the same P-term elements (i.e., 211(1) and 211(4)) that generate the set and reset control signals selectively applied to flip flop circuit 450). As mentioned above, because both the set and reset control signals are rarely applied to the same flip-flop in a user's logic function, the present invention provides the P-term clock enable signal PTCE without requiring dedicated circuitry (i.e., the use of an additional P-term element) to provide the clock enable control signal PTCE. Therefore, the present invention provides a clock enable function without significantly changing the architecture of conventional CPLD 100 (described above).

FIG. 6 is a schematic diagram showing flip flop circuit 450 in accordance with a specific embodiment of the present invention. Flip flop circuit 450 includes conventional D-type flip flop 310 and (first) multiplexer 320 that are described above with reference to FIG. 3(A). Flip flop circuit 450 also includes an exclusive-OR (XOR) gate 610 having a second input terminal connected to receive the DATA signal value transmitted from XOR gate 233, a first input terminal connected to the output terminal of a second multiplexer 620, and an output terminal connected to the second input terminal 324 of first multiplexer 320. Second multiplexer 620 also includes a first input terminal connected to an output terminal of a third multiplexer 630, and a second input terminal connected to a logic zero source. Third multiplexer 630 also includes a second input terminal connected to data output terminal Q of flip flop 310, and a first input terminal connected to receive the DATA signal value transmitted from XOR gate 233.

When configured in a first operational state, flip flop circuit 450 operates essentially as described above with reference to conventional macrocell 230. In the first operational state, first multiplexer 320 is programmed (i.e., controlled by a configuration memory cell, not shown) to pass signals from second input terminal 324 to data input terminal D of flip flop 310, second multiplexer 620 is programmed to transmit the logic zero value to the first input terminal of XOR gate 610, and multiplexer 630 is programmed to transmit data values from data output terminal Q. Under these conditions, the DATA signal value is passed by first multiplexer 320 to data input terminal D of flip flop 310, is then latched and transmitted from data output terminal Q, and then passed out of flip flop 450 via third multiplexer 630.

The first operational state assumes that a fixed (e.g., constant logic one) P-term clock enable signal PTCE is applied to the select terminal of first multiplexer 320. As described above with reference to FIG. 3(B), this operational state is selectively toggled between clock enabled operation and clock disabled operation by selectively transmitting logic one and logic zero values to the select terminal of first multiplexer 320, thereby causing flip flop 450 to operate in the manner described above with reference to FIG. 3(B).

Although the present invention has been described with respect to certain specific embodiments, it will be clear to those skilled in the art that the inventive features of the present invention are applicable to other embodiments as well, all of which are intended to fall within the scope of the present invention. For example, the various logic gates and multiplexers (switches) illustrated in the first and second embodiments are provided to describe the distinct functional operations of the disclosed circuit in a convenient manner. Using known techniques, two or more of these distinct functions may be implemented by combined circuitry that does not directly correlate to the logic gates and multiplexers of the above embodiments. An example of how the inventive features of the present invention may be implemented using such circuitry is illustrated in the specific embodiment described below with reference to FIG. 7.

Figure 7:
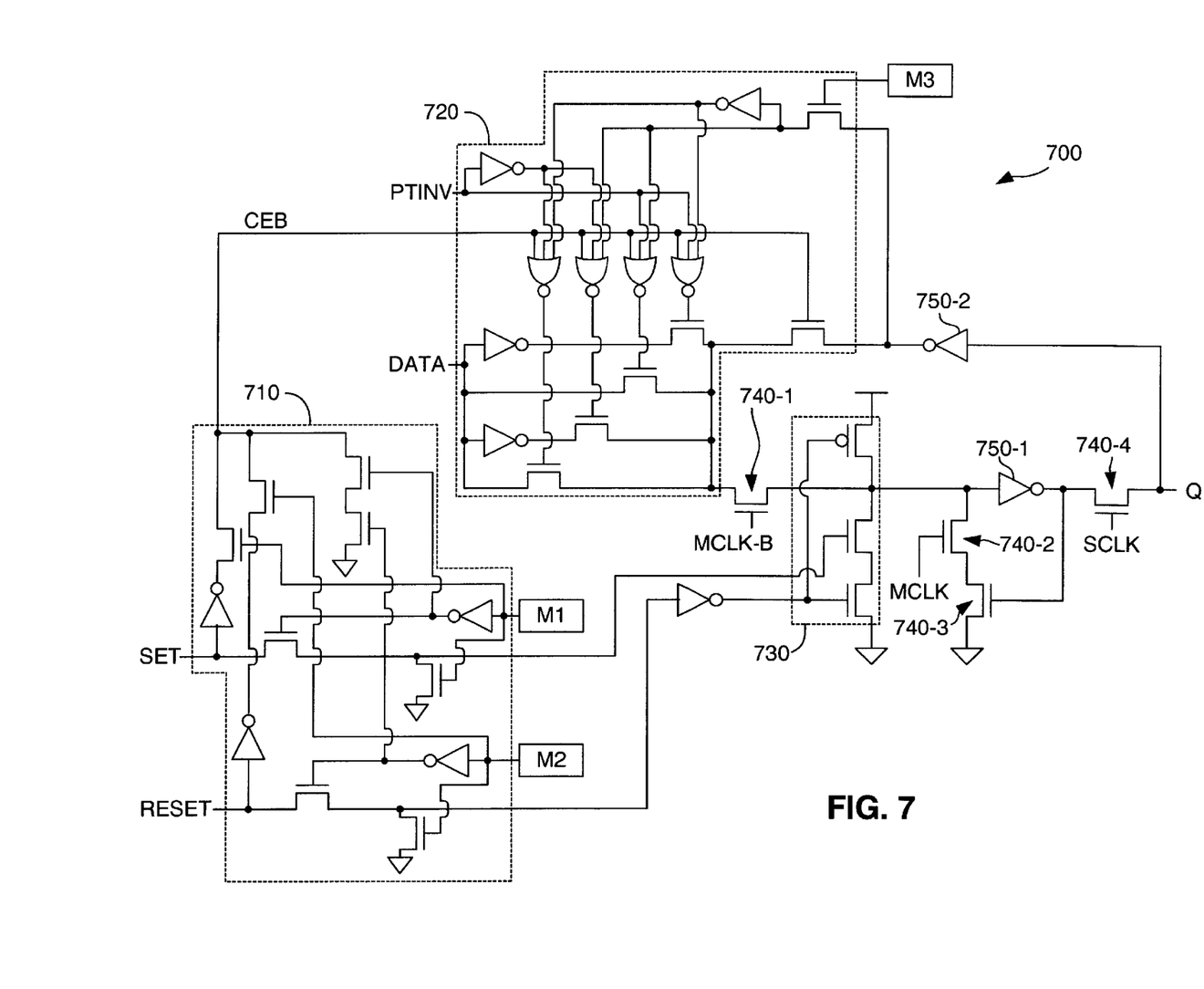
FIG. 7 is a circuit diagram showing a flip flop circuit in accordance with another embodiment of the present invention.

FIG. 7 is a circuit diagram illustrating a portion of a PLD 700 in accordance with a third embodiment of the present invention. PLD 700 is separated into several circuit groups that combine some of the logic functions performed by the logic gates and multiplexers of P-term allocator circuit 410 and macrocell 430 of the second embodiment (described above). For example, PLD 700 includes a first circuit group 710 including a series of pass transistors and inverters that are utilized to perform the logic functions associated with first multiplexer 340, second multiplexer 350 and third multiplexer 360 of P-term allocator circuit 410 (see FIG. 5). Further, a second circuit group 720 includes NOR gates, pass transistors and inverters that perform the logic functions associated with multiplexer 234 and XOR gate 233 (shown in FIG. 5), along with the logic functions associated with XOR gate 610 and multiplexers 320, 620, and 630 (shown in FIG. 6). In addition, flip flop set and reset functions are performed by a third circuit group 730, flip flop clocking functions are performed by pass transistors 740-1 through 740-4 (in response to a master clock (MCLK) signal, an inverted master clock (MCLK-B) signal and a slave clock signal (SCLK) signal). Finally, inverters 750-1 and 750-2 provide the flip flop storage latch in accordance with known techniques.

Those skilled in the art will recognize that the specific embodiment shown in FIG. 7 represents only one of several embodiments in which two or more of the novel features of the present invention may be combined.

We claim:

1. A clock enable control circuit for controlling a flip flop, the flip flop having a data input terminal, a set terminal, a reset terminal, a data output terminal, and a clock input terminal, the clock enable control circuit comprising:

a data multiplexer having a first input terminal connected to the data output terminal of the flip flop, a second input terminal for receiving a data signal, an output terminal connected to the data input terminal of the flip flop, and a select terminal; and a switching circuit including means for selectively passing a set control signal either to the set terminal of the flip flop or to the select terminal of the data multiplexer, and means for selectively passing a reset control signal either to the reset terminal of the flip flop or to the select terminal of the data multiplexer, wherein the data multiplexer is selectively controlled using either of the set control signal or the reset control signal to feed back a data value stored in the data output terminal to the data input terminal of the flip flop, thereby effectively disabling a clock signal applied to the clock input terminal of the flip flop.

2. The clock enable control circuit according to claim 1, wherein the switching circuit comprises:

a first switch having an input terminal connected to receive the set control signal, and an output terminal connected to the set terminal of the flip flop;

a second switch having an input terminal connected to receive the reset control signal, and an output terminal connected to the reset terminal of the flip flop; and a third switch having a first input terminal connected to receive the set control signal, a second input terminal connected to receive the reset control signal, and an output terminal connected to the select terminal of the data multiplexer.

3. The clock enable control circuit according to claim 2, wherein the first switch comprises a first multiplexer having a select terminal connected to a first memory cell;

wherein the second switch comprises a second multiplexer having a select terminal connected to a second memory cell; and wherein the third switch comprises a third multiplexer having a first select terminal connected to the first memory cell, and a second select terminal connected to the second memory cell.

4. The clock enable control circuit according to claim 3, wherein each of the first and second multiplexers includes a second input terminal connected to a predetermined logic level.

5. The clock enable control circuit according to claim 3, wherein the third multiplexer includes a third input terminal connected to a predetermined logic level.

6. A programmable logic device comprising:

a flip flop having a data input terminal, a set terminal, a reset terminal, a data output terminal, and a clock input terminal;

a data multiplexer having a first input terminal connected to the data output terminal of the flip flop, a second input terminal for receiving a data signal, an output terminal connected to the data input terminal of the flip flop, and a select terminal; and means for selectively passing a set control signal either to the set terminal of the flip flop or to the select terminal of the data multiplexer;

means for selectively passing a reset control signal either to the reset terminal of the flip flop or to the select terminal of the data multiplexer;

wherein the data multiplexer is selectively controlled using either of the set control signal or the reset control signal to feed back a data value stored in the data output terminal to the data input terminal of the flip flop, thereby effectively disabling a clock signal applied to the clock input terminal of the flip flop.

7. The programmable logic device according to claim 6, wherein said means for selectively passing the set control signal comprises:

a first switch having an input terminal connected to receive the set control signal, and an output terminal connected to the set terminal of the flip flop; and a third switch having a first input terminal connected to receive the set control signal, and an output terminal connected to the select terminal of the data multiplexer.

8. The programmable logic device according to claim 6, wherein said means for selectively passing the set control signal comprises:

a first switch having an input terminal connected to receive the set control signal, and an output terminal;

a product-term multiplexer connected between the output terminal of the first switch and the set terminal of the flip flop; and a third switch having a first input terminal connected to receive the set control signal, and an output terminal connected to the select terminal of the data multiplexer.

9. The programmable logic device according to claim 8, further comprising:

a plurality of product-term elements including a first product term element for generating the set control signal, and a second product-term element for generating the reset control signal;

a demultiplexer having an input terminal connected to the first product-term element, a first output terminal connected to the first input terminal of the first switch, and a second output terminal; and a logic OR gate connected between the second output terminal of the demultiplexer and the second input terminal of the data multiplexer.

10. The programmable logic device according to claim 6, wherein said means for selectively passing the reset control signal comprises:

a second switch having an input terminal connected to receive the reset control signal, and an output terminal connected to the reset terminal of the flip flop, and a third switch having a second input terminal connected to receive the reset control signal, and an output terminal connected to the select terminal of the data multiplexer.

11. The programmable logic device according to claim 6, wherein said means for selectively passing the reset control signal comprises:

a second switch having an input terminal connected to receive the reset control signal, and an output terminal;

a product-term multiplexer connected between the output terminal of the second switch and the reset terminal of the flip flop; and a third switch having a second input terminal connected to receive the reset control signal, and an output terminal connected to the select terminal of the data multiplexer.

12. The programmable logic device according to claim 11, further comprising:

a plurality of product-term elements including a first product term element for generating the set control signal, and a second product-term element for generating the reset control signal;

a demultiplexer having an input terminal connected to the second product-term element, a first output terminal connected to the first input terminal of the first switch, and a second output terminal; and a logic OR gate connected between the second output terminal of the demultiplexer and the second input terminal of the data multiplexer.

13. A programmable logic device comprising a flip flop and a clock enable control circuit for controlling the flip flop, the clock enable control circuit including:

first means for selectively passing either a first data signal or a second data signal to a data input terminal of the flip flop;

second means for selectively passing a set control signal either to a set terminal of the flip flop or to the first means; and third means for selectively passing a reset control signal either to a reset terminal of the flip flop or to the first means;

wherein the first means is selectively controlled using either of the set control signal or the reset control signal to feed back the second data signal from an output terminal of the flip flop, thereby effectively disabling a clock signal applied to a clock input terminal of the flip flop.

* * * * *